United States Patent
Shih et al.

(10) Patent No.: US 8,269,712 B2
(45) Date of Patent: Sep. 18, 2012

(54) HIGH-RELIABILITY GATE DRIVING CIRCUIT

(75) Inventors: Chih-Jen Shih, Changhua County (TW); Chun-Kuo Yu, Taoyuan County (TW); Chun-Yuan Hsu, Taipei County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 613 days.

(21) Appl. No.: 12/465,630

(22) Filed: May 13, 2009

(65) Prior Publication Data
US 2010/0177068 A1 Jul. 15, 2010

(30) Foreign Application Priority Data
Jan. 9, 2009 (TW) ................................ 98100770 A

(51) Int. Cl.
G09G 3/36 (2006.01)
H03K 19/096 (2006.01)
(52) U.S. Cl. .......... 345/100; 345/104; 345/204; 326/97; 377/64; 377/77; 377/78
(58) Field of Classification Search .................. 345/204, 345/100, 104; 377/64–81; 326/97
See application file for complete search history.

(56) References Cited

U.S. PATENT DOCUMENTS

| 5,222,082 A | 6/1993 | Plus |
| 6,426,743 B1 | 7/2002 | Yeo |
| 6,970,530 B1 | 11/2005 | Wang |
| 7,203,264 B2 | 4/2007 | Lo |
| 7,342,991 B2 | 3/2008 | Wei |
| 7,406,147 B2 | 7/2008 | Lo |
| 2006/0061562 A1* | 3/2006 | Park et al. ...................... 345/204 |
| 2006/0158419 A1* | 7/2006 | Li ................. 345/100 |
| 2007/0171115 A1* | 7/2007 | Kim et al. ...................... 341/155 |
| 2007/0188436 A1* | 8/2007 | Wei et al. ...................... 345/100 |
| 2007/0194973 A1* | 8/2007 | Nakao et al. ................... 341/155 |
| 2008/0068326 A1* | 3/2008 | Chen et al. ..................... 345/100 |
| 2008/0100560 A1* | 5/2008 | Na et al. ........................ 345/101 |
| 2008/0219401 A1* | 9/2008 | Tobita .............................. 377/79 |
| 2008/0285705 A1* | 11/2008 | Wei et al. ........................ 377/78 |

FOREIGN PATENT DOCUMENTS

| CN | 101533623 A | 9/2009 |
| JP | 200624350 A | 1/2006 |
| JP | 2006309893 A | 11/2006 |

* cited by examiner

*Primary Examiner* — Grant Sitta
*Assistant Examiner* — MD Saiful A Siddiqui
(74) *Attorney, Agent, or Firm* — Winston Hsu; Scott Margo

(57) ABSTRACT

A high-reliability gate driving circuit is disclosed for providing a plurality of gate signals to plural gate lines respectively. The gate driving circuit includes a plurality of shift register stages. Each shift register stage includes a pull-up unit, an energy-store unit, a buffer unit, a discharging unit, a first pull-down unit, a second pull-down unit and a control unit. The pull-up unit pulls up a gate signal according to a driving control voltage and a first clock. The buffer unit receives an input signal. The energy-store unit provides the driving control voltage through performing a charging process based on the input signal. The first pull-down unit pulls down the gate signal according to a control signal. The second pull-down unit pulls down the gate signal according to a second clock having a phase opposite to the first clock. The control unit generates the control signal based on the gate signal.

13 Claims, 8 Drawing Sheets

HIGH-RELIABILITY GATE DRIVING CIRCUIT

BACKGROUND OF THE INVENTION

1. Field of the Invention

The present invention relates to a gate driving circuit, and more particularly, to a high-reliability gate driving circuit having alternating pull-down mechanism.

2. Description of the Prior Art

Because the liquid crystal display (LCD) has advantages of thin appearance, low power consumption, and low radiation, the liquid crystal display has been widely applied in various electronic products for panel displaying. The operation of a liquid crystal display is featured by varying voltage drops between opposite sides of a liquid crystal layer for twisting the angles of the liquid crystal molecules in the liquid crystal layer so that the transmittance of the liquid crystal layer can be controlled for illustrating images with the aid of the light source provided by a backlight module.

In general, the liquid crystal display comprises a plurality of pixel units, a gate driving circuit, and a source driving circuit. The source driving circuit is utilized for providing a plurality of data signals to be written into the pixel units. The gate driving circuit comprises a plurality of shift register stages and functions to provide a plurality of gate driving signals for controlling related writing operations of the pixel units. That is, the gate driving circuit is a crucial device for providing a control of writing the data signals into the pixel units.

FIG. 1 is a schematic diagram showing a prior-art gate driving circuit. As shown in FIG. 1, for ease of explanation, the gate driving circuit 100 illustrates only a (N−1)th shift register stage 111, an Nth shift register stage 112, and a (N+1)th shift register stage 113. For sake of brevity, only the internal structure of the Nth shift register stage 112 is exemplified. The Nth shift register stage 112 is employed to generate a gate signal SGn according to a first clock CK1, a second clock CK2, and a gate signal SGn−1. The gate signal SGn is furnished to a corresponding pixel unit of a pixel array 101 via a gate line GLn so as to control a writing operation for writing the data signal of the data line DLi into the pixel unit. Furthermore, the gate signal SGn is forwarded to the (N+1)th shift register stage 113 and functions as a start pulse signal for activating the (N+1)th shift register stage 113. The Nth shift register stage 112 comprises a pull-up unit 120, an energy-store unit 135, a buffer unit 140, a pull-down unit 150, a discharging unit 155, and a control unit 160.

The energy store unit 135 is used to generate a driving control voltage VQn through performing a charging process based on the gate signal SGn−1 received by the buffer unit 140. The pull-up unit 120 is utilized for pulling up the gate signal SGn of the gate line GLn according to the driving control voltage VQn and the first clock CK1. The control unit 160 comprises a plurality of transistors for generating a control signal SCn based on the gate signal SGn−1 and the second clock CK2 having a phase opposite to the first clock CK1. The discharging unit 155 is utilized for pulling down the driving control voltage VQn to a low power voltage Vss by performing a discharging process on the energy-store unit 135 according to the control signal SCn. The pull-down unit 150 is employed to pull down the gate signal SGn to the low power voltage Vss based on the control signal SCn.

However, in the operation of the gate driving circuit 100, except for the interval during which the Nth shift register stage 112 is activated for generating the gate signal SGn having high voltage level, the control signal SCn holds high voltage level for enabling the pull-down unit 150 and the discharging unit 155. That is the transistors 151, 156 of the pull-down unit 150 and the discharging unit 155 maintain turn-on state in most of operating time, which is likely to incur an occurrence of threshold voltage drift and degrades the reliability and life-time of the gate driving circuit 100.

SUMMARY OF THE INVENTION

In accordance with an embodiment of the present invention, a gate driving circuit for providing a plurality of gate signals to a plurality of gate lines is disclosed. The gate driving circuit comprises a plurality of shift register stages. An Nth shift register stage of the shift register stages comprises a pull-up unit, a buffer unit, an energy-store unit, a discharging unit, a first pull-down unit, a second pull-down unit, and a control unit.

The pull-up unit is electrically connected to an Nth gate line of the gate lines and functions to pull up an Nth gate signal of the gate signals to a high voltage level according to a driving control voltage and a first clock. The buffer unit is employed to receive an input signal. The energy-store unit is electrically connected to the pull-up unit and the buffer unit. The energy-store unit is utilized for providing the driving control voltage to the pull-up unit through performing a charging process based on the input signal. The discharging unit is electrically connected to the energy-store unit for pulling down the driving control voltage to a low power voltage according to a control signal. The first pull-down unit is electrically connected to the Nth gate line for pulling down the Nth gate signal to the low power voltage according to the control signal. The second pull-down unit is electrically connected to the Nth gate line for pulling down the Nth gate signal to the low power voltage according to a second clock having a phase opposite to the first clock. The control unit is electrically connected to the discharging unit and the first pull-down unit and functions to generate the control signal based on the Nth gate signal.

In accordance with another embodiment of the present invention, a gate driving circuit for providing a plurality of gate signals to a plurality of gate lines is disclosed. The gate driving circuit comprises a plurality of shift register stages. An Nth shift register stage of the shift register stages comprises a pull-up unit, a buffer unit, an energy-store unit, a first discharging unit, a second discharging unit, a first pull-down unit, and a second pull-down unit.

The pull-up unit is electrically connected to an Nth gate line of the gate lines and functions to pull up an Nth gate signal of the gate signals to a high voltage level according to a driving control voltage and a first clock. The buffer unit is employed to receive an input signal. The energy-store unit is electrically connected to the pull-up unit and the buffer unit. The energy-store unit is utilized for providing the driving control voltage to the pull-up unit through performing a charging process based on the input signal. The first discharging unit is electrically connected to the energy-store unit for pulling down the driving control voltage according to the first clock and the Nth gate signal. The second discharging unit is electrically connected to the energy-store unit for pulling down the driving control voltage to a low power voltage according to a (N+1)th gate signal of the gate signals. The first pull-down unit is electrically connected to the Nth gate line for pulling down the Nth gate signal to the low power voltage according to a second clock having a phase opposite to the first clock. The second pull-down unit is electrically connected to the Nth gate line for pulling down the Nth gate signal to the low power voltage according to the (N+1)th gate signal.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
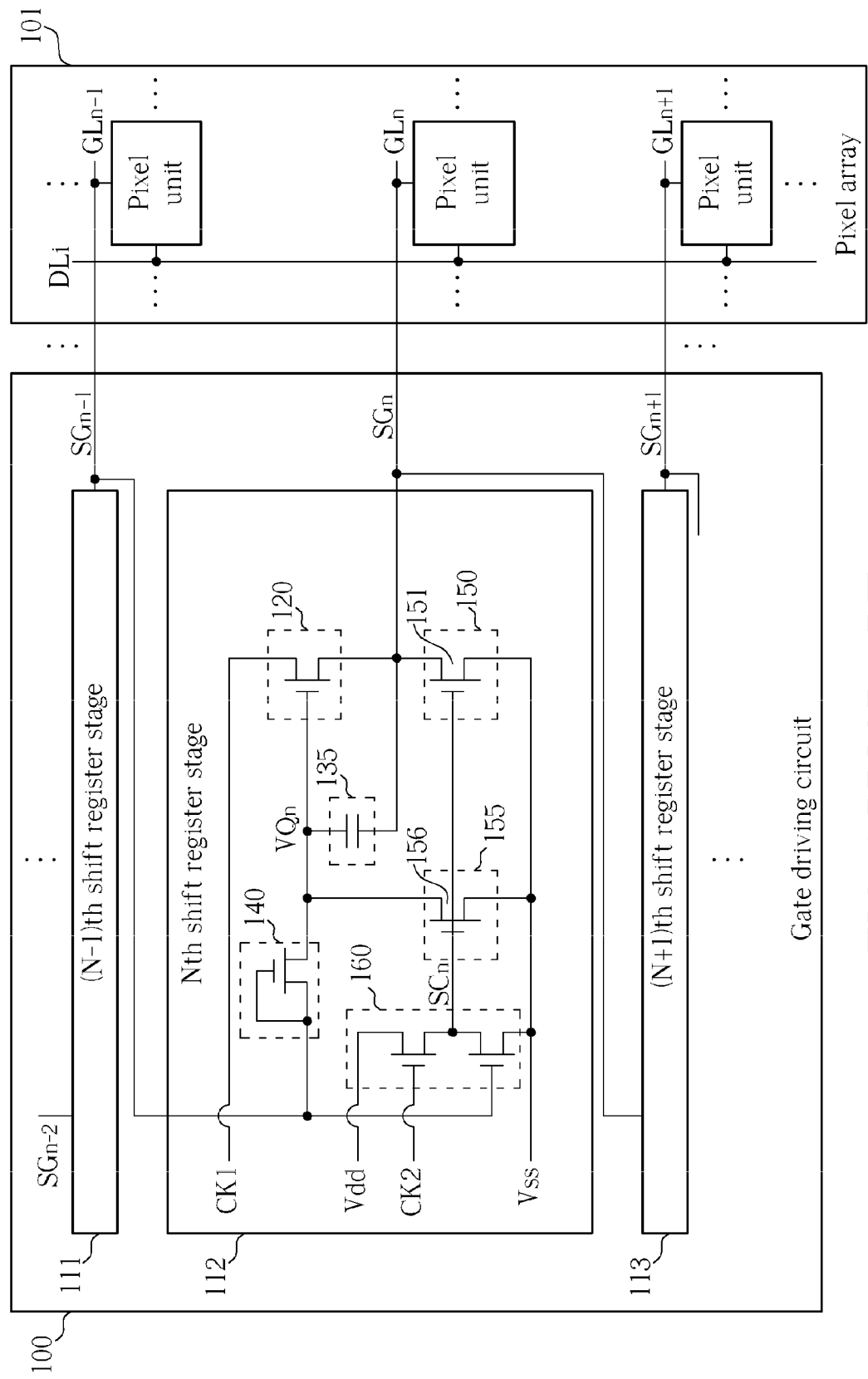
FIG. 1 is a schematic diagram showing a prior-art gate driving circuit.
Figure 2:
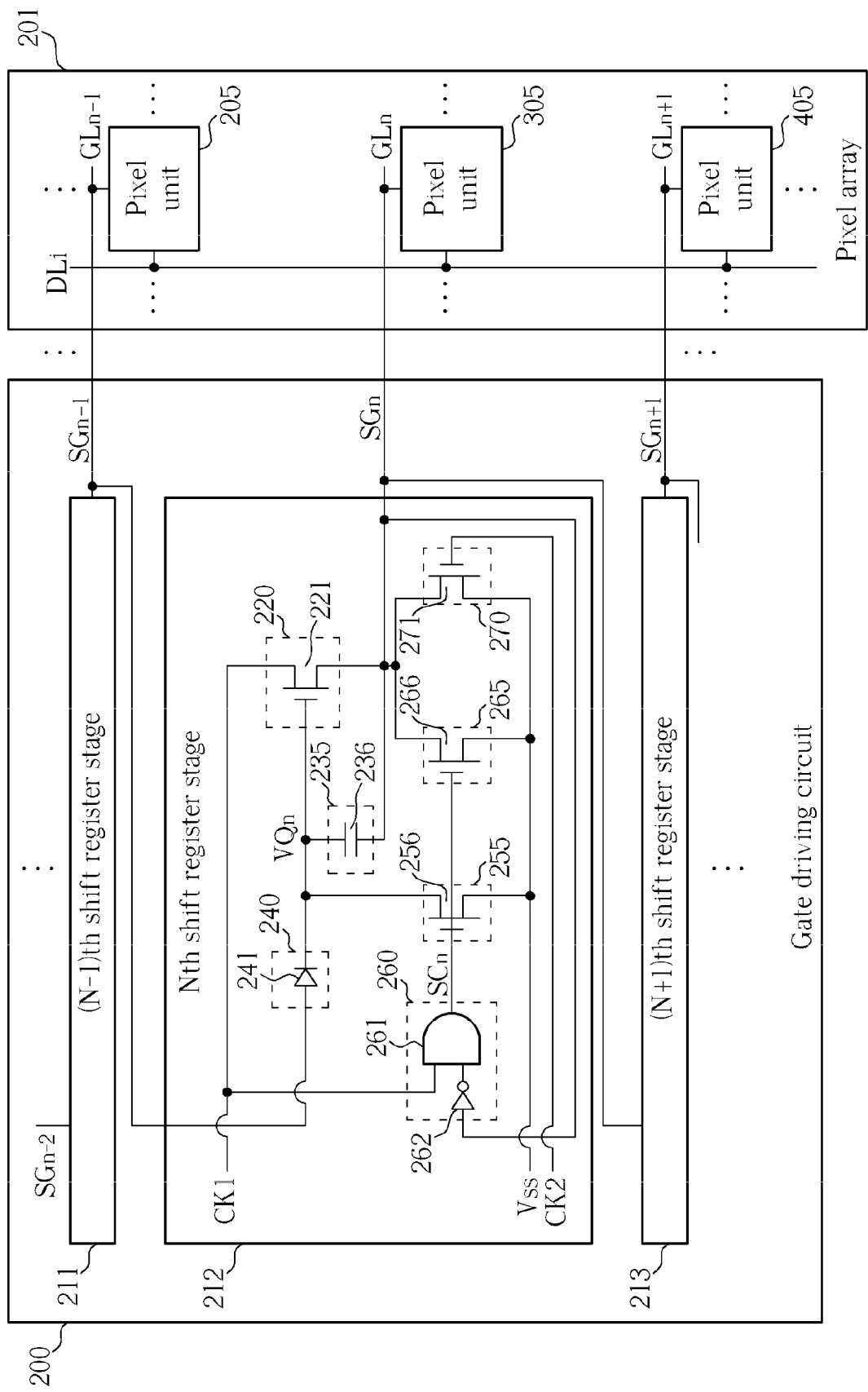
FIG. 2 is a schematic diagram showing a gate driving circuit in accordance with a first embodiment of the present invention.

FIG. 2 is a schematic diagram showing a gate driving circuit in accordance with a first embodiment of the present invention. As shown in FIG. 2, the gate driving circuit 200 comprises a plurality of shift register stages and, for ease of explanation, illustrates only a (N−1)th shift register stage 211, an Nth shift register stage 212, and a (N+1)th shift register stage 213. For sake of brevity, only the internal structure of the Nth shift register stage 212 is exemplified. The other shift register stages are similar to the Nth shift register stage 212 and can be inferred by analogy. The (N−1)th shift register stage 211 is employed to provide a gate signal SGn−1, the Nth shift register stage 212 is employed to provide a gate signal SGn, and the (N+1)th shift register stage 213 is employed to provide a gate signal SGn+1. The gate signal SGn−1 is furnished to a pixel unit 205 of a pixel array 201 via a gate line GLn−1 so as to control a writing operation of the pixel unit 205 for writing a corresponding data signal of the data line DLi into the pixel unit 205. The gate signal SGn is furnished to a pixel unit 305 of the pixel array 201 via a gate line GLn so as to control a writing operation of the pixel unit 305 for writing a corresponding data signal of the data line DLi into the pixel unit 305. The gate signal SGn+1 is furnished to a pixel unit 405 of the pixel array 201 via a gate line GLn+1 so as to control a writing operation of the pixel unit 405 for writing a corresponding data signal of the data line DLi into the pixel unit 405.

The Nth shift register stage 212 comprises a pull-up unit 220, an energy-store unit 235, a buffer unit 240, a discharging unit 255, a control unit 260, a first pull-down unit 265, and a second pull-down unit 270. The pull-up unit 220 is electrically connected to the gate line GLn and functions to pull up the gate signal SGn of the gate line GLn based on the driving control voltage VQn and the first clock CK1. The buffer unit 240 is electrically connected to the (N−1)th shift register stage 211 for receiving the gate signal SGn−1. That is, the gate signal SGn−1 is also used as a start pulse signal for activating the Nth shift register stage 212. The energy-store unit 235 is electrically connected to the pull-up unit 220 and the buffer unit 240 and functions to provide the driving control voltage VQn to the pull-up unit 220 through performing a charging process based on the gate signal SGn−1. The control unit 260 is electrically connected to the discharging unit 255 and the first pull-down unit 265 for providing a control signal SCn based on the first clock CK1 and the gate signal SGn. The discharging unit 255 is electrically connected to the energy-store unit 235 for pulling down the driving control voltage VQn to a low power voltage Vss by performing a discharging process based on the control signal SCn. The first pull-down unit 265 is electrically connected to the gate line GLn for pulling down the gate signal SGn to the low power voltage Vss according to the control signal SCn. Besides, the second pull-down unit 270 is also electrically connected to the gate line GLn for pulling down the gate signal SGn to the low power voltage Vss according to a second clock CK2 having a phase opposite to the first clock CK1.

In the embodiment shown in FIG. 2, the buffer unit 240 comprises a diode 241, the pull-up unit 220 comprises a first switch 221, the energy-store unit 235 comprises a capacitor 236, the discharging unit 255 comprises a second switch 256, the first pull-down unit 265 comprises a third switch 266, the second pull-down unit 270 comprises a fourth switch 271, and the control unit 260 comprises an AND gate 261 and an inverter 262. The diode 241 comprises a positive end electrically connected to the (N−1)th shift register stage 211 for receiving the gate signal SGn−1 and a negative end electrically connected to the capacitor 236. The first switch 221 comprises a first end for receiving the first clock CK1, a gate end electrically connected to the negative end of the diode 241, and a second end electrically connected to the gate line GLn. The capacitor 236 comprises a first end electrically connected to the gate end of the first switch 221 and a second end electrically connected to the second end of the first switch 221.

The second switch 256 comprises a first end electrically connected to the first end of the capacitor 236, a second end for receiving the low power voltage Vss, and a gate end electrically connected to the control unit 260 for receiving the control signal SCn. The third switch 266 comprises a first end electrically connected to the second end of first switch 221, a second end for receiving the low power voltage Vss, and a gate end electrically connected to the control unit 260 for receiving the control signal SCn. The fourth switch 271 comprises a first end electrically connected to the second end of the first switch 221, a second end for receiving the low power voltage Vss, and a gate end for receiving the second clock CK2. The first switch 221 through the fourth switch 271 are thin film transistors, metal oxide semiconductor (MOS) field effect transistors, or junction field effect transistors. The AND gate 261 comprises a first input end for receiving the first clock CK1, a second input end, and an output end electrically connected to the second switch 256 and the third switch 266 for outputting the control signal SCn to the gate ends of the second switch 256 and the third switch 266. The inverter 262 comprises an input end electrically connected to the second end of the first switch 221 for receiving the gate signal SGn and an output end electrically connected to the second input end of the AND gate 261. In view of that, the control unit 260 outputs the control signal SCn having high voltage level for turning on the second switch 256 and the third switch 266 only when the first clock CK1 has high voltage level and the gate signal SGn has low voltage level.

Figure 3:
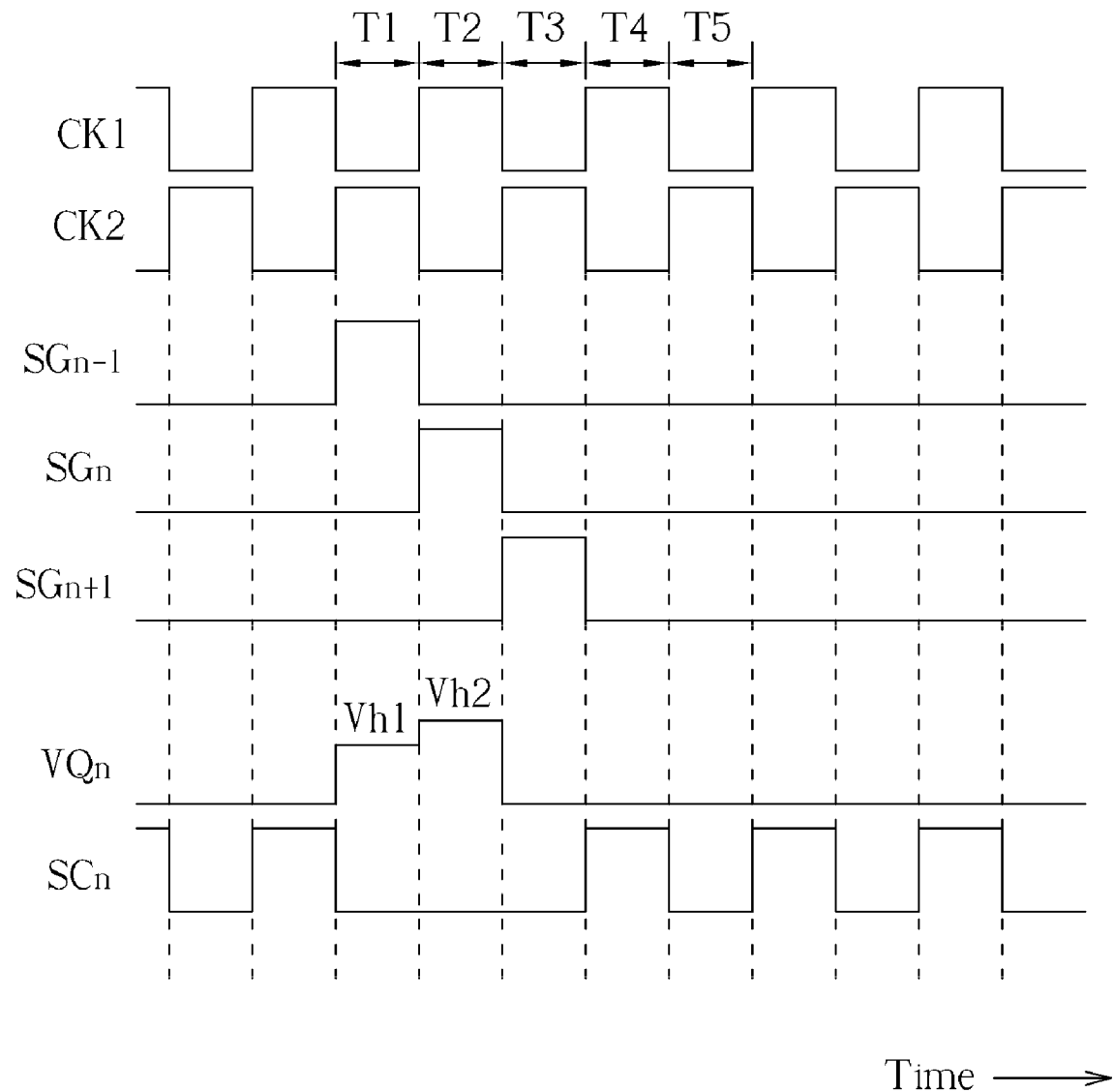
FIG. 3 is a schematic diagram showing related signal waveforms regarding the operation of the gate driving circuit in FIG. 2, having time along the abscissa.

FIG. 3 is a schematic diagram showing related signal waveforms regarding the operation of the gate driving circuit in FIG. 2, having time along the abscissa. The signal waveforms in FIG. 3, from top to bottom, are the first clock CK1, the second clock CK2, the gate signal SGn−1, the gate signal SGn, the gate signal SGn+1, the driving control voltage VQn, and the control signal SCn.

As shown in FIG. 3, during an interval T1, the gate signal SGn−1 is shifting from low voltage level to high voltage level, the diode 241 is then forward-biased for charging the capacitor 236 so as to boost the driving control voltage VQn to a first high voltage Vh1. In the meantime, the first clock CK1 is switching to low voltage level so that the control signal SCn is also switching to low voltage level for turning off the second switch 256 and the third switch 266. During an interval T2, the gate signal SGn−1 is falling down from high voltage level to low voltage level, the diode 241 is then reverse-biased and the driving control voltage VQn becomes a floating voltage. Meanwhile, along with the switching of the first clock CK1 to high voltage level, the driving control voltage VQn is further boosted from the first high voltage Vh1 to a second high voltage Vh2 due to a capacitive coupling effect caused by the device capacitor of the first switch 221. Accordingly, the first switch 221 is turned on for pulling up the gate signal SGn from low voltage level to high voltage level. Although the first clock CK1 has high voltage level during the interval T2, the control signal SCn still retains low voltage level so as to continue turning off the second switch 256 and the third switch 266 in that the gate signal SGn has high voltage level during the interval T2.

During an interval T3, the second clock CK2 is switching to high voltage level so that the fourth switch 271 is turned on for pulling down the gate signal SGn to low voltage level; furthermore, the driving control voltage VQn is also pulled down to low voltage level due to a capacitive coupling effect caused by the capacitor 236. In the meantime, although the gate signal SGn has low voltage level, the control signal SCn still maintains low voltage level so as to continue turning off the second switch 256 and the third switch 266 in that the first clock CK1 is switching to low voltage level during the interval T3. Besides, by making use of the gate signal SGn as a start pulse signal, the (N+1)th shift register stage 213 is enabled to generate the gate signal SGn+1 having high voltage level during the interval T3.

During an interval T4, the second clock CK2 is switching to low voltage level and turns off the fourth switch 271. Concurrently, the control signal SCn is switching to high voltage level in that the first switch CK1 is switching to high voltage level and the gate signal SGn has low voltage level. Accordingly, the second switch 256 and the third switch 266 are turned on for pulling down the driving control voltage VQn and the gate signal SGn to the low power voltage Vss. During an interval T5, the first clock CK1 is switching to low voltage level and therefore the control signal SCn is also switching to low voltage level for turning off the second switch 256 and the third switch 266. In the meantime, the second clock CK2 is switching to high voltage level and turns on the fourth switch 271 for pulling down the gate signal SGn to the low power voltage Vss. Thereafter, as long as the gate signal SGn continues holding low voltage level, the aforementioned circuit operations, during the intervals T4 and T5, are repeated periodically so that the gate signal SGn can be retained to low voltage level by means of alternatively turning on the third switch 266 and the fourth switch 271. For that reason, the threshold voltage drift regarding the third switch 266 and the fourth switch 271 can be lessened significantly for enhancing the reliability and life-time of the gate driving circuit 200. It is noted that although the second switch 256 is turned off and the driving control voltage VQn becomes a floating voltage during the interval T5, the driving control voltage VQn cannot exceed the threshold voltage at the moment and the gate driving circuit 200 is then able to function properly in that the driving control voltage VQn is periodically pulled down to the low power voltage Vss.

Figure 4:
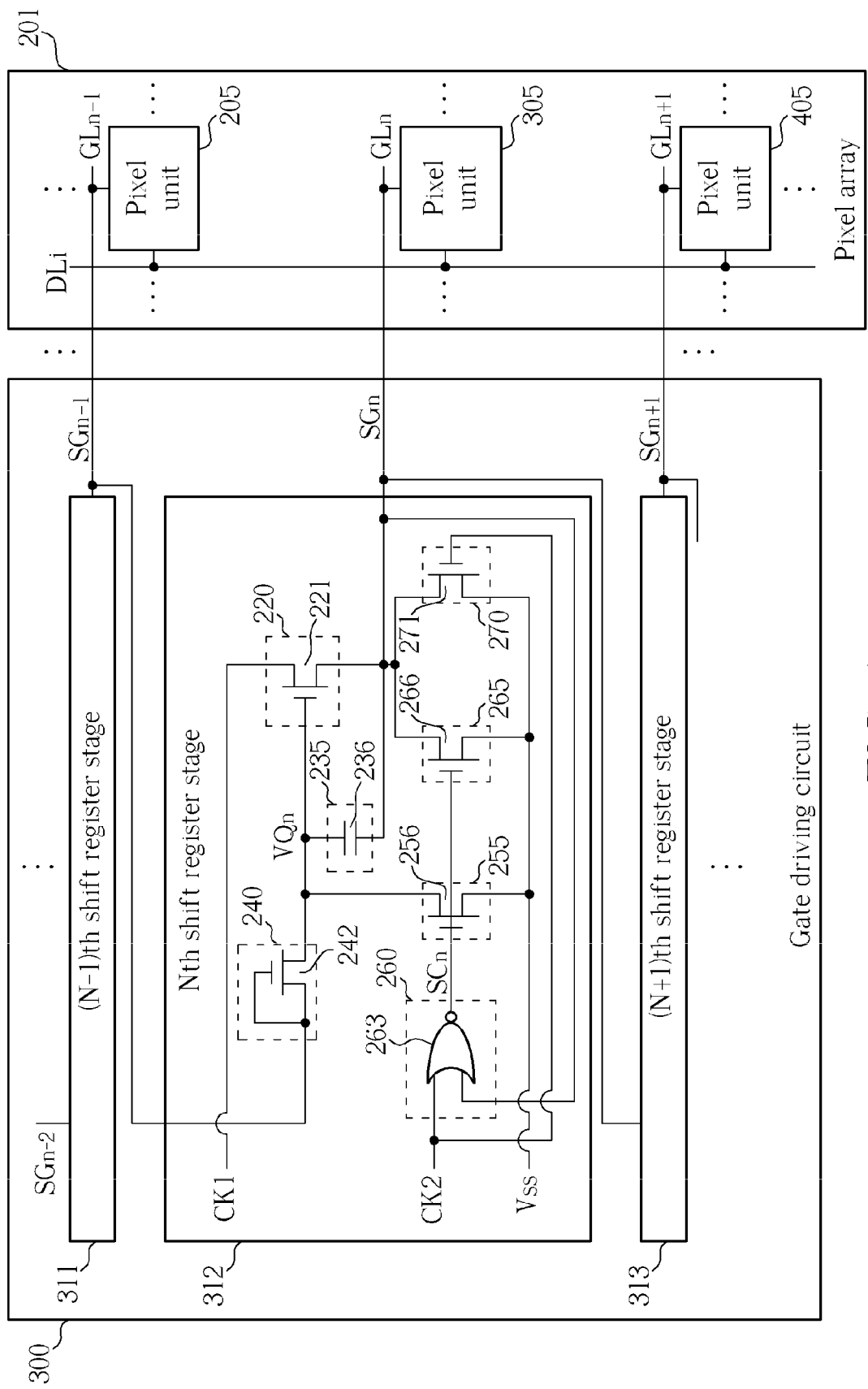
FIG. 4 is a schematic diagram showing a gate driving circuit in accordance with a second embodiment of the present invention.

FIG. 4 is a schematic diagram showing a gate driving circuit in accordance with a second embodiment of the present invention. As shown in FIG. 4, the gate driving circuit 300 comprises a plurality of shift register stages and, for ease of explanation, the gate driving circuit 300 still illustrates only a (N−1)th shift register stage 311, an Nth shift register stage 312, and a (N+1)th shift register stage 313. In the internal structure of the Nth shift register stage 312, the buffer unit 240 comprises a buffer transistor 252 and the control unit 260 comprises a NOR gate 263. The buffer transistor 242 comprises a first end electrically connected to the (N−1)th shift register stage 311 for receiving a gate signal SGn−1, a gate end electrically connected to the first end, and a second end electrically connected to the first end of the capacitor 236. The buffer transistor 242 is a thin film transistor, a MOS field effect transistor or a junction field effect transistor. The NOR gate 263 comprises a first input end for receiving the second clock CK2, a second input end electrically connected to the second end of the first switch 221, and an output end electrically connected to the second switch 256 and the third switch 266 for outputting the control signal SCn to the gate ends of the second switch 256 and the third switch 266. Other shift register stages, such as the (N−1)th shift register stage 311 and the (N+1)th shift register stage 313, can be inferred by analogy. Except for the abovementioned internal connecting relationships of each shift register stage in the gate driving circuit 300, other internal connecting relationships of each shift register stage in FIG. 4 are similar to those of the Nth shift register stage 212 in FIG. 2. The related signal waveforms regarding the operation of the gate driving circuit 300 are also identical to the signal waveforms shown in FIG. 3, and for the sake of brevity, further similar discussion thereof is omitted.

Figure 5:
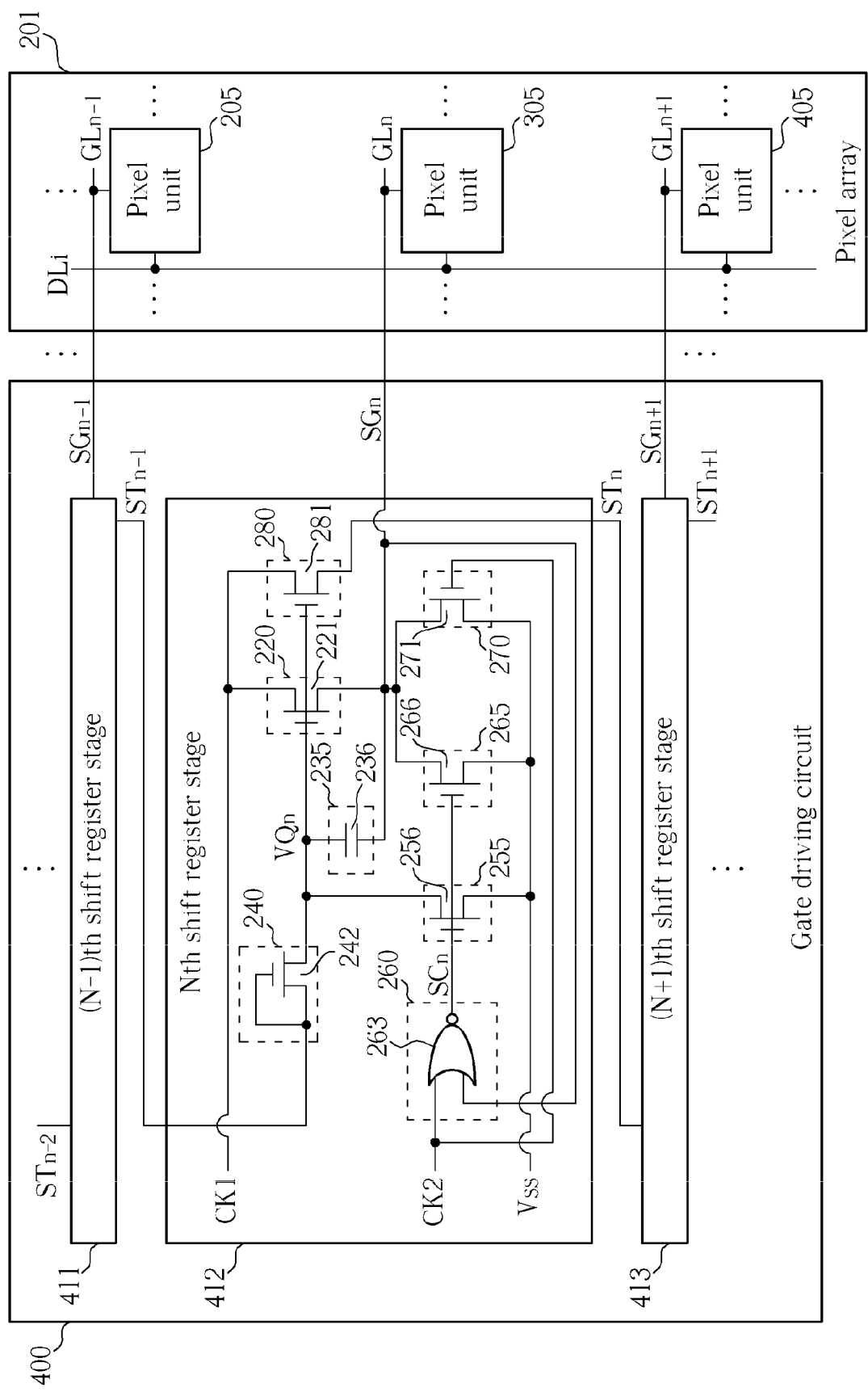
FIG. 5 is a schematic diagram showing a gate driving circuit in accordance with a third embodiment of the present invention.

FIG. 5 is a schematic diagram showing a gate driving circuit in accordance with a third embodiment of the present invention. As shown in FIG. 5, the gate driving circuit 400 comprises a plurality of shift register stages and, for ease of explanation, the gate driving circuit 400 still illustrates only a (N−1)th shift register stage 411, an Nth shift register stage 412, and a (N+1)th shift register stage 413. Compared with the gate driving circuit 300 shown in FIG. 4, the (N−1)th shift register stage 411 further provides a start pulse signal STn−1, the Nth shift register stage 412 further provides a start pulse signal STn, and the (N+1)th shift register stage 413 further provides a start pulse signal STn+1. The waveform of the start pulse signal STn−1 is substantially identical to that of the gate signal SGn−1, the waveform of the start pulse signal STn is substantially identical to that of the gate signal SGn, and the waveform of the start pulse signal STn+1 is substantially identical to that of the gate signal SGn+1. Compared with the Nth shift register stage 312 shown in FIG. 4, the Nth shift register stage 412 further comprises a carry unit 280. The carry unit 280 comprises a fifth switch 281 for generating the start pulse signal STn based on the driving control voltage VQn and the first clock CK1. The start pulse signal STn is forwarded to the (N+1)th shift register stage 413. The fifth switch 281 comprises a first end for receiving the first clock CK1, a gate end electrically connected to the first end of the capacitor 236, and a second end for outputting the start pulse signal STn to the (N+1)th shift register stage 413. The fifth transistor 281 is a thin film transistor, a MOS field effect transistor, or a junction field effect transistor. Besides, the first end of the buffer transistor 242 is electrically connected to the (N−1)th shift register stage 411 for receiving the start pulse signal STn−1. Other shift register stages, such as the (N−1)th shift register stage 411 and the (N+1)th shift register stage 413, can be inferred by analogy. Except for the abovementioned internal connecting relationships of each shift register stage in the gate driving circuit 400, other internal connecting relationships of each shift register stage in FIG. 5 are similar to those of the Nth shift register stage 312 in FIG. 4. The related signal waveforms regarding the operation of the gate driving circuit 400 are also identical to the signal waveforms shown in FIG. 3, and for the sake of brevity, further similar discussion thereof is omitted.

Figure 6:
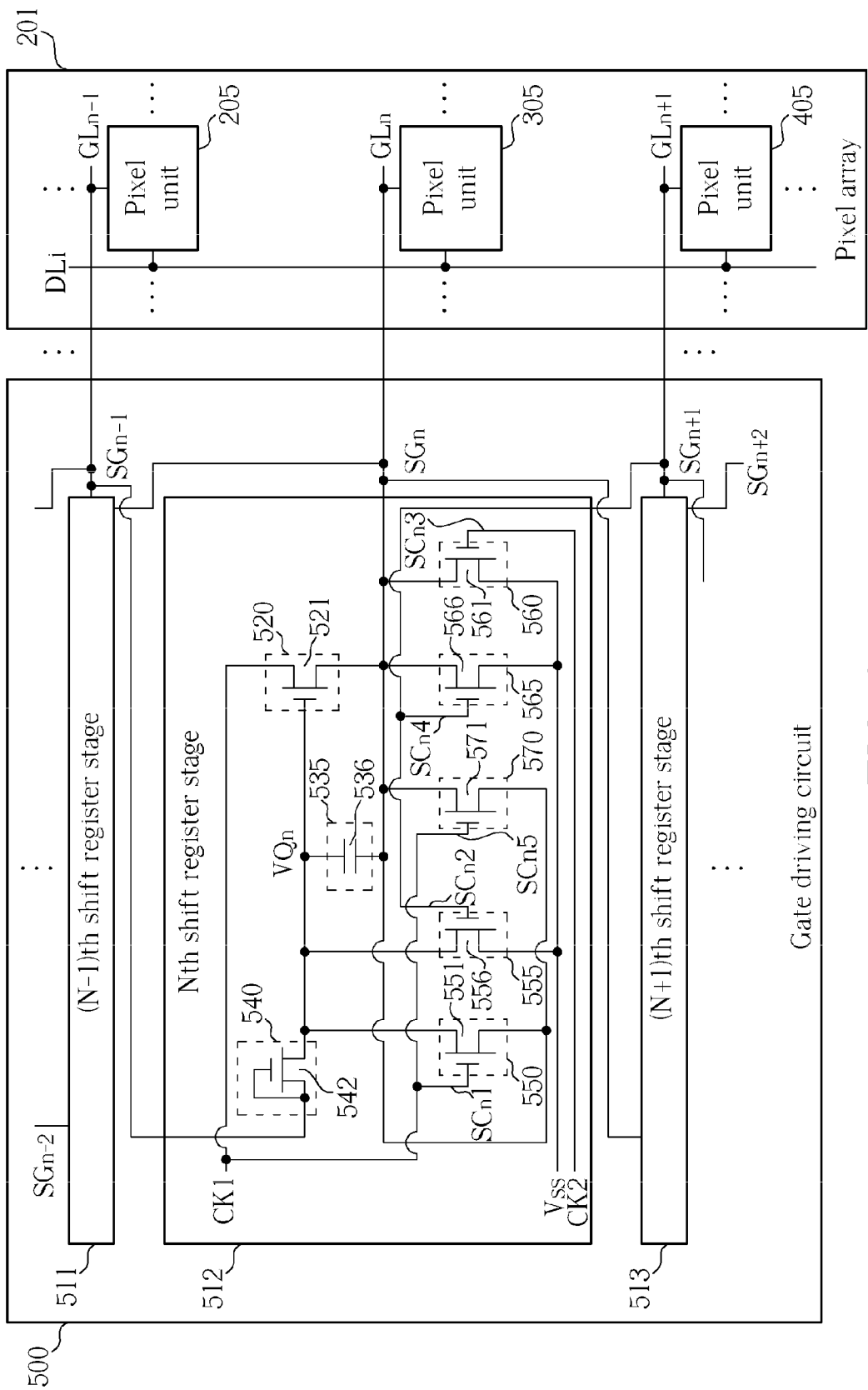
FIG. 6 is a schematic diagram showing a gate driving circuit in accordance with a fourth embodiment of the present invention.

FIG. 6 is a schematic diagram showing a gate driving circuit in accordance with a fourth embodiment of the present invention. As shown in FIG. 6, the gate driving circuit 500 comprises a plurality of shift register stages and, for ease of explanation, the gate driving circuit 500 still illustrates only a (N−1)th shift register stage 511, an Nth shift register stage 512, and a (N+1)th shift register stage 513. Also, only the internal structure of the Nth shift register stage 512 is exemplified. The other shift register stages are similar to the Nth shift register stage 512 and can be inferred by analogy. The (N−1)th shift register stage 511 is employed to provide a gate signal SGn−1, the Nth shift register stage 512 is employed to provide a gate signal SGn, and the (N+1)th shift register stage 513 is employed to provide a gate signal SGn+1.

The Nth shift register stage 512 comprises a pull-up unit 520, an energy-store unit 535, a buffer unit 540, a first discharging unit 550, a second discharging unit 555, an auxiliary unit 570, a first pull-down unit 560, and a second pull-down unit 565. The pull-up unit 520 is electrically connected to the gate line GLn and functions to pull up the gate signal SGn of the gate line GLn based on the driving control voltage VQn and the first clock CK1. The buffer unit 540 is electrically connected to the (N−1)th shift register stage 511 for receiving the gate signal SGn−1. That is, the gate signal SGn−1 is also used as a start pulse signal for activating the Nth shift register stage 512. The energy-store unit 535 is electrically connected to the pull-up unit 520 and the buffer unit 540 and functions to provide the driving control voltage VQn to the pull-up unit 520 through performing a charging process based on the gate signal SGn−1. The first discharging unit 550 is electrically connected to the energy-store unit 535 for pulling down the driving control voltage VQn by performing a discharging process based on a first clock CK1 and the gate signal SGn. The second discharging unit 555 is electrically connected to the energy-store unit 535 for pulling down the driving control voltage VQn to a low power voltage Vss by performing a discharging process based on the gate signal SGn+1.

The first pull-down unit 560 is electrically connected to the gate line GLn for pulling down the gate signal SGn to the low power voltage Vss according to a second clock CK2 having a phase opposite to the first clock CK1. The second pull-down unit 560 is also electrically connected to the gate line GLn for pulling down the gate signal SGn to the low power voltage Vss according to the gate signal SGn+1. The auxiliary unit 570 is electrically connected between the gate line GLn and the first discharging unit 550 and functions to control an auxiliary electrical connection between the gate line GLn and the first discharging unit 550 according to the first clock CK1.

In the embodiment shown in FIG. 6, the buffer unit 540 comprises a buffer transistor 542, the pull-up unit 520 comprises a first switch 521, the energy-store unit 535 comprises a capacitor 536, the first discharging unit 550 comprises a second switch 551, the second discharging unit 555 comprises a third switch 556, the first pull-down unit 560 comprises a fourth switch 561, the second pull-down unit 565 comprises a fifth switch 566, and the auxiliary unit 570 comprises a sixth switch 571. The buffer transistor 542 comprises a first end electrically connected to the (N−1)th shift register stage 511 for receiving the gate signal SGn−1, a gate end electrically connected to the first end, and a second end electrically connected to the capacitor 536. The buffer transistor 542 is a thin film transistor, a MOS field effect transistor or a junction field effect transistor. In another embodiment, the buffer unit 540 comprises a diode having a positive end electrically connected to the (N−1)th shift register stage 511 for receiving the gate signal SGn−1 and a negative end electrically connected to the capacitor 536.

The first switch 521 comprises a first end for receiving the first clock CK1, a gate end electrically connected to the second end of the buffer transistor 542, and a second end electrically connected to the gate line GLn. The capacitor 536 comprises a first end electrically connected to the gate end of the first switch 521 and a second end electrically connected to the second end of the first switch 521. The second switch 551 comprises a first end electrically connected to the first end of the capacitor 536, a gate end for receiving the first clock as a switch control signal SCn1, and a second end electrically connected to the second end of the first switch 521. The third switch 556 comprises a first end electrically connected to the first end of the capacitor 536, a gate end electrically connected to the gate line GLn+1 for receiving the gate signal SGn+1 as a switch control signal SCn2, and a second end for receiving the low power voltage Vss.

The fourth switch 561 comprises a first end electrically connected to the second end of the first switch 521, a gate end for receiving the second clock CK2 as a switch control signal SCn3, and a second end for receiving the low power voltage Vss. The fifth switch 566 comprises a first end electrically connected to the second end of the first switch 521, a gate end electrically connected to the gate line GLn+1 for receiving the gate signal SGn+1 as a switch control signal SCn4, and a second end for receiving the low power voltage Vss. The sixth switch 571 comprises a first end electrically connected to the second end of the first switch 521, a gate end for receiving the first clock CK1 as a switch control signal SCn5, and a second end electrically connected to the second end of the second switch 551. The first switch 521 through the sixth switch 571 are thin film transistors, MOS field effect transistors, or junction field effect transistors.

Figure 7:
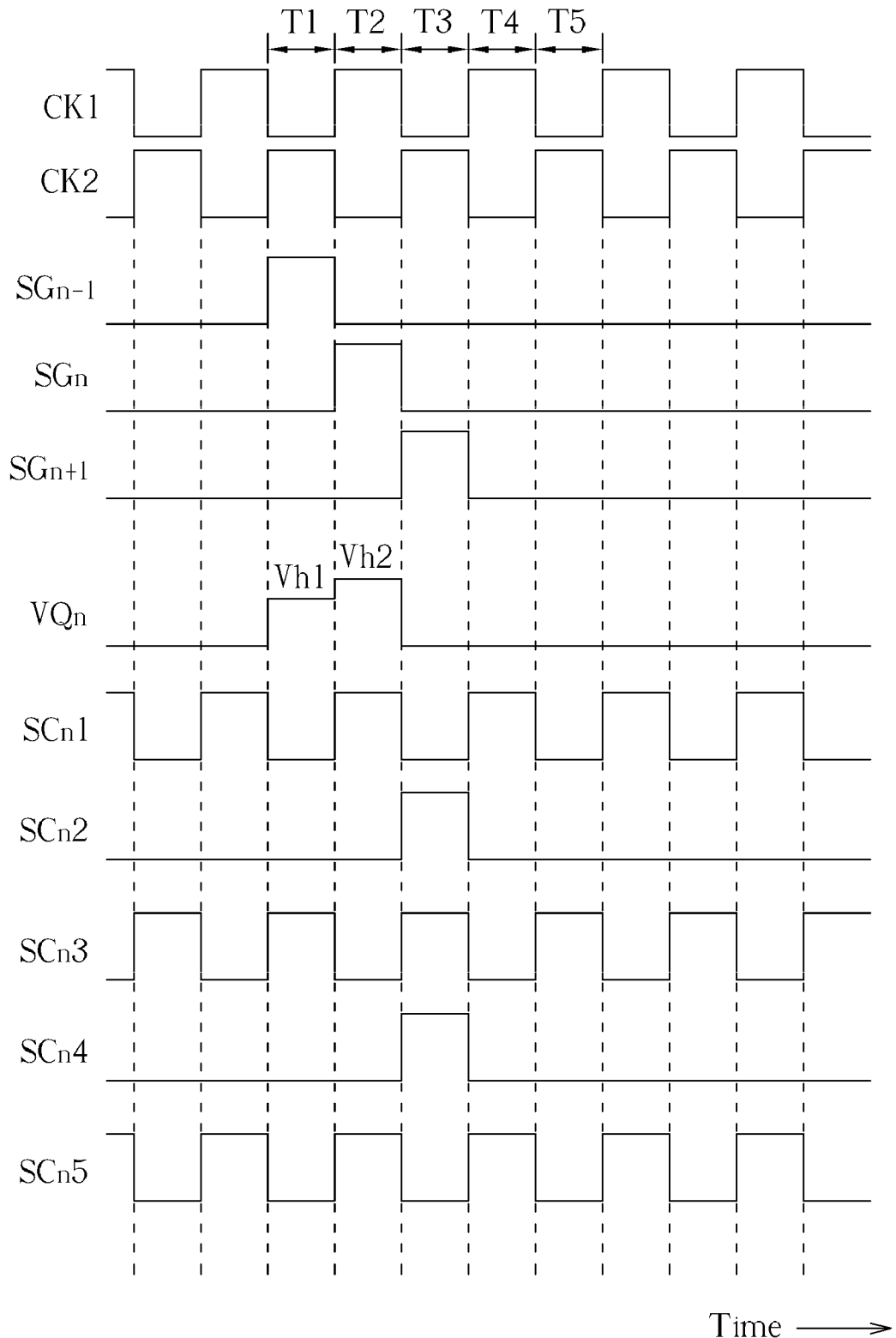
FIG. 7 is a schematic diagram showing related signal waveforms regarding the operation of the gate driving circuit in FIG. 6, having time along the abscissa.

FIG. 7 is a schematic diagram showing related signal waveforms regarding the operation of the gate driving circuit in FIG. 6, having time along the abscissa. The signal waveforms in FIG. 7, from top to bottom, are the first clock CK1, the second clock CK2, the gate signal SGn−1, the gate signal SGn, the gate signal SGn+1, the driving control voltage VQn, the switch control signal SCn1, the switch control signal SCn2, the switch control signal SCn3, the switch control signal SCn4, and the switch control signal SCn5.

As shown in FIG. 7, during an interval T1, the gate signal SGn−1 is shifting from low voltage level to high voltage level, the buffer transistor 542 is then turned on for charging the capacitor 536 so as to boost the driving control voltage VQn to a first high voltage Vh1. In the meantime, the first clock CK1 is switching to low voltage level and the second clock CK2 is switching to high level voltage, i.e. the switch control signals SCn1 and SCn5 are switching to low voltage level and the switch control signal SCn3 is switching to high voltage level. Accordingly, the second switch 551 and the sixth switch 571 are turned off, and the fourth switch 561 is turned on so that the gate signal SGn still retains low voltage level. Furthermore, since the gate signal SGn+1 holds low voltage level, and therefore the switch control signals SCn2 and SCn4 keep low voltage level so as to continue turning off the third switch 556 and the fifth switch 566.

During an interval T2, the gate signal SGn−1 is falling down from high voltage level to low voltage level, the buffer transistor 542 is then turned off and the driving control voltage VQn becomes a floating voltage. Meanwhile, along with the switching of the first clock CK1 to high voltage level, the driving control voltage VQn is further boosted from the first high voltage Vh1 to a second high voltage Vh2 due to a capacitive coupling effect caused by the device capacitor of the first switch 521. Accordingly, the first switch 521 is turned on for pulling up the gate signal SGn from low voltage level to high voltage level. Concurrently, the second clock CK2 is switching to low voltage level and the gate signal SGn+1 retains low voltage level, i.e. the switch control signal SCn3 is switching to low voltage level and the switch control signals SCn2 and SCn4 maintain low voltage level. Accordingly, the third switch 556, the fourth switch 561 and the fifth switch 566 are all turned off. Although the switch control signals SCn1 and SCn5 are switching to high voltage level following the switching of the first clock CK1, the second switch 551 and the sixth switch 571 continue turn-off state in that both the driving control voltage VQn and the gate signal SGn have high voltage level.

During an interval T3, by making use of the gate signal SGn as a start pulse signal, the (N+1)th shift register stage 513 is enabled to generate the gate signal SGn+1 having high voltage level. In the meantime, the second clock CK2 is switching to high voltage level, and therefore the switch control signal SCn3 is switching to high voltage level and turns on the fourth switch 561 for pulling down the gate signal SGn to the low power voltage Vss. Since the gate signal SGn+1 is switching to high voltage level, i.e. both the switch control signals SCn2 and SCn4 are switching to high voltage level, the third switch 556 is turned on for pulling down the driving control voltage VQn to the low power voltage Vss, and the fifth switch 566 is turned on for pulling down the gate signal SGn to the low power voltage Vss. Besides, the first clock CK1 is switching to low voltage level, and therefore both the switch control signals SCn1 and SCn5 are switching to low voltage level so as to continue turning off the second switch 551 and the sixth switch 571.

During an interval T4, the second clock CK2 is switching to low voltage level, and therefore the switch control signal SCn3 is switching to low voltage level for turning off the fourth switch 561. Meanwhile, the gate signal SGn+1 is switching to low voltage level, i.e. the switch control signals SCn2 and SCn4 are switching to low voltage level, and therefore both the third switch 556 and the fifth switch 566 are turned off. Concurrently, the first switch CK1 is switching to high voltage level, i.e. both the switch control signals SCn1 and SCn5 are switching to high voltage level, and therefore both the second switch 551 and the sixth switch 571 are turned on so that the driving control voltage VQn keeps low voltage level. It is noted that the sixth switch 571 is employed to provide an auxiliary electrical connection between the second end of the second switch 551 and the gate line SGn for enhancing reliability, and consequently the sixth switch 571 can be omitted without failing normal circuit operation.

During an interval T5, the first clock CK1 is switching to low voltage level, and therefore both the second switch 551 and the sixth switch 571 are turned off. In the meantime, the gate signal SGn+1 holds low voltage level, and therefore both the switch control signals SCn2 and SCn4 keep low voltage level so as to continue turning off the third switch 556 and the fifth switch 566. Concurrently, the second clock CK2 is switching to high voltage level, and therefore the switch control signal SCn3 is switching to high voltage level and turns on the fourth switch 561 for pulling down the gate signal SGn to the low power voltage Vss. Thereafter, as long as the gate signal SGn continues holding low voltage level, the aforementioned circuit operations, during the intervals T4 and T5, are repeated periodically so that the gate signal SGn and the driving control voltage VQn can be retained to low voltage level by means of alternatively turning on the fourth switch 561 and the second switch 551. For that reason, the threshold voltage drift regarding the fourth switch 561 and the second switch 551 can be lessened significantly for enhancing the reliability and life-time of the gate driving circuit 500.

Figure 8:
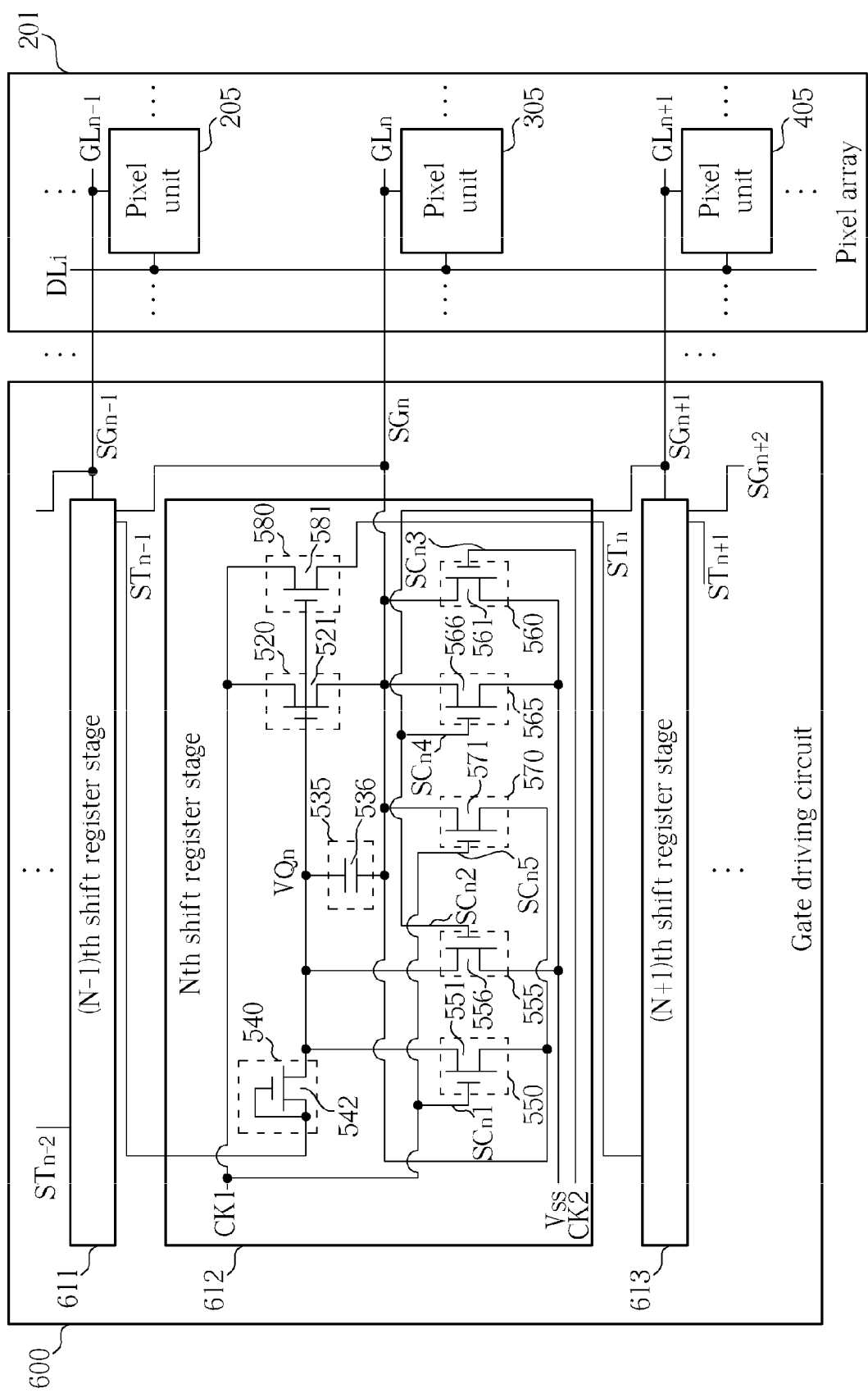
FIG. 8 is a schematic diagram showing a gate driving circuit in accordance with a fifth embodiment of the present invention.

FIG. 8 is a schematic diagram showing a gate driving circuit in accordance with a fifth embodiment of the present invention. As shown in FIG. 8, the gate driving circuit 600 comprises a plurality of shift register stages and, for ease of explanation, the gate driving circuit 600 still illustrates only a (N−1)th shift register stage 611, an Nth shift register stage 612, and a (N+1)th shift register stage 613. Compared with the gate driving circuit 500 shown in FIG. 6, the (N−1)th shift register stage 611 further provides a start pulse signal STn−1, the Nth shift register stage 612 further provides a start pulse signal STn, and the (N+1)th shift register stage 613 further provides a start pulse signal STn+1. The waveform of each start pulse signal is substantially identical to that of one corresponding gate signal. Compared with the Nth shift register stage 512 shown in FIG. 6, the Nth shift register stage 612 further comprises a carry unit 580. The carry unit 580 comprises a seventh switch 581 for generating the start pulse signal STn based on the driving control voltage VQn and the first clock CK1. The start pulse signal STn is forwarded to the (N+1)th shift register stage 613. The seventh switch 581 comprises a first end for receiving the first clock CK1, a gate end electrically connected to the first end of the capacitor 536, and a second end for outputting the start pulse signal STn to the (N+1)th shift register stage 613. The seventh transistor 581 is a thin film transistor, a MOS field effect transistor, or a junction field effect transistor. Besides, the first end of the buffer transistor 542 is electrically connected to the (N−1)th shift register stage 611 for receiving the start pulse signal STn−1. Other shift register stages, such as the (N−1)th shift register stage 611 and the (N+1)th shift register stage 613, can be inferred by analogy. Except for the abovementioned internal connecting relationships of each shift register stage in the gate driving circuit 600, other internal connecting relationships of each shift register stage in FIG. 8 are similar to those of the Nth shift register stage 512 in FIG. 6. The related signal waveforms regarding the operation of the gate driving circuit 600 are also identical to the signal waveforms shown in FIG. 7, and for the sake of brevity, further similar discussion thereof is omitted.

In summary, regarding the operation of shift register stages in the gate driving circuit of the present invention, the gate signals can be retained to low voltage level by means of an alternative pulling-down operation mechanism, and therefore the threshold voltage drift is lessened significantly for enhancing the reliability and life-time of the gate driving circuit.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A gate driving circuit for providing a plurality of gate signals to a plurality of gate lines, the gate driving circuit comprising a plurality of shift register stages, an Nth shift register stage of the shift register stages comprising:
   a pull-up unit, electrically connected to an Nth gate line of the gate lines, for pulling up an Nth gate signal of the gate signals to a high voltage level according to a driving control voltage and a first clock;
   a buffer unit for receiving an input signal;
   an energy-store unit, electrically connected to the pull-up unit and the buffer unit, for providing the driving control voltage to the pull-up unit through performing a charging process based on the input signal;
   a first discharging unit, electrically connected to the energy-store unit, for pulling down the driving control voltage according to the first clock and the Nth gate signal;
   a second discharging unit, electrically connected to the energy-store unit, for pulling down the driving control voltage to a low power voltage according to an (N+1)th gate signal of the gate signals;
   a first pull-down unit, electrically connected to the Nth gate line, for pulling down the Nth gate signal to the low power voltage according to a second clock having a phase opposite to the first clock;
   a second pull-down unit, electrically connected to the Nth gate line, for pulling down the Nth gate signal to the low power voltage according to the (N+1)th gate signal; and
   an auxiliary unit, electrically connected between the Nth gate line and the first discharging unit, for controlling an auxiliary electrical connection between the Nth gate line and the first discharging unit according to the first clock;
   wherein an end of the first discharging unit electrically connected to the auxiliary unit is not electrically connected to the lower power voltage when the auxiliary unit is turned on.

2. The gate driving circuit of claim 1, wherein the pull-up unit comprises
   a transistor, the transistor comprising:
   a first end for receiving the first clock;
   a gate end electrically connected to the energy-store unit for receiving the driving control voltage; and
   a second end electrically connected to the Nth gate line.

3. The gate driving circuit of claim 1, wherein the energy-store unit comprises a capacitor.

4. The gate driving circuit of claim 1, wherein the buffer unit comprises a transistor, the transistor comprising:
   a first end electrically connected to an (N−1)th shift register stage for receiving an (N−1)th gate signal;
   a gate end electrically connected to the first end; and
   a second end electrically connected to the energy-store unit;
   wherein the input signal is the (N−1)th gate signal.

5. The gate driving circuit of claim 1, wherein the buffer unit comprises a diode, the diode comprising:
   a positive end electrically connected to an (N−1)th shift register stage for receiving an (N−1)th gate signal; and
   a negative end electrically connected to the energy-store unit;
   wherein the input signal is the (N−1)th gate signal.

6. The gate driving circuit of claim 1, wherein the first discharging unit comprises a transistor, the transistor comprising:
   a first end electrically connected to the energy-store unit;
   a gate end for receiving the first clock; and
   a second end electrically connected to the Nth gate line.

7. The gate driving circuit of claim 1, wherein the second discharging unit comprises a transistor, the transistor comprising:
   a first end electrically connected to the energy-store unit;
   a gate end for receiving the (N+1)th gate signal; and
   a second end for receiving the low power voltage.

8. The gate driving circuit of claim 1, wherein the first pull-down unit comprises a transistor, the transistor comprising:
   a first end electrically connected to the Nth gate line;
   a gate end for receiving the second clock; and
   a second end for receiving the low power voltage.

9. The gate driving circuit of claim 1, wherein the second pull-down unit comprises a transistor, the transistor comprising:
   a first end electrically connected to the Nth gate line;
   a gate end for receiving the (N+1)th gate signal; and
   a second end for receiving the low power voltage.

10. The gate driving circuit of claim 1, wherein the auxiliary unit comprises a transistor, the transistor comprising:
    a first end electrically connected to the Nth gate line;
    a gate end for receiving the first clock; and
    a second end electrically connected to the first discharging unit.

11. The gate driving circuit of claim 1, wherein the Nth shift register stage further comprises:
    a carry unit, electrically connected to the energy-store unit, for generating an Nth start pulse signal according to the driving control voltage and the first clock, the Nth start pulse signal being forwarded to a buffer unit of an (N+1)th shift register stage.

12. The gate driving circuit of claim 11, wherein the carry unit of the Nth shift register stage comprises a transistor, the transistor comprising:
    a first end for receiving the first clock;
    a gate end electrically connected to the energy-store unit for receiving the driving control voltage; and
    a second end electrically connected to the buffer unit of the (N+1)th shift register stage.

13. The gate driving circuit of claim 11, wherein the buffer unit of the Nth shift register stage comprises a transistor, the transistor comprising:
    a first end for receiving an (N−1)th start pulse signal generated by a carry unit of an (N−1)th shift register stage;
    a gate end electrically connected to the first end; and
    a second end electrically connected to the energy-store unit;
    wherein the input signal is the (N−1)th start pulse signal.

* * * * *